United States Patent
Kuo

[11] Patent Number: 6,076,594
[45] Date of Patent: Jun. 20, 2000

[54] HEAT DISSIPATING DEVICE

[76] Inventor: Ching-Sung Kuo, No. 38, Lane 111, Nan-Tien-Mu Rd., Tu-Cheng City, Taipei Hsien, Taiwan

[21] Appl. No.: 09/182,579

[22] Filed: Oct. 29, 1998

[51] Int. Cl.[7] .................................................... H05K 7/20
[52] U.S. Cl. .......................................... 165/80.3; 165/185
[58] Field of Search ................................ 165/80.3, 185; 174/16.3; 361/704, 710; 257/722

[56] References Cited

U.S. PATENT DOCUMENTS

| | | | |
|---|---|---|---|
| 4,897,712 | 1/1990 | Prokopp | 357/81 |
| 5,020,586 | 6/1991 | Mansingh | 165/80.3 |
| 5,419,041 | 5/1995 | Ozeki | 29/890.03 |
| 5,509,465 | 4/1996 | Lai | 165/80.3 |
| 5,583,317 | 12/1996 | Mennucci et al. | 174/16.3 |
| 5,777,259 | 7/1998 | Mennucci et al. | 174/16.3 |

FOREIGN PATENT DOCUMENTS

| | | | |
|---|---|---|---|
| 0 385 205 A2 | 5/1992 | European Pat. Off. | H05K 7/20 |
| 0 485 205 A3 | 5/1992 | European Pat. Off. | H05K 7/20 |
| 2 286 922 | 8/1995 | United Kingdom | H01L 23/36 |

*Primary Examiner*—Allen Flanigan
*Attorney, Agent, or Firm*—Hoffmann & Baron, LLP

[57] ABSTRACT

A heat dissipating device includes a plurality of heat dissipating plates which are disposed side by side. Each of the heat dissipating plates has a stack plate portion and a fin plate portion that extends integrally from the stack plate portion and that has a thickness smaller than that of the stack plate portion. The stack plate portions of the heat dissipating plates are in close contact with one another, and cooperatively form a stack part with a flat contact face adapted to be placed in contact with a heat generating article. The fin plate portions of the heat dissipating plates cooperatively form a fin part.

2 Claims, 5 Drawing Sheets

HEAT DISSIPATING DEVICE

BACKGROUND OF THE INVENTION

1. Field of the Invention

This invention relates to a heat dissipating device, more particularly to a heat dissipating device which results in an enhanced heat dissipating effect, and which is easy to manufacture and assemble.

2. Description of the Related Art

A conventional heat dissipating device has a stack portion that includes a plurality of alternately disposed first and second stack plates which are disposed side by side and which are in close contact with one another, and a fin portion that includes a plurality of fin plates extending integrally and respectively from the second stack plates. The stack portion has a flat surface for contact with a heat generating article. The heat dissipating device of this type has been disclosed in U.S. Pat. Nos. 4,897,712 and 5,020,586. Although the heat dissipating device of the aforementioned type provides a larger heat dissipating area than an integrally formed heat dissipating device, it suffers from the following drawbacks:

Heat from a heat generating article is essentially dissipated via the fin plates of the heat dissipating device. The first stack plates, which do not have fin plates formed thereon, mainly act to transfer heat from the article to the fin plates via the first stack plates. Since the first and second stack plates are separately formed, contact surfaces between the first and second stack plates can retard the heat transfer effect between the first and second stack plates, thereby adversely affecting the heat dissipating efficiency of the device.

In addition, since each of the second stack plates has the fin plates formed integrally therewith and thus, has a size different from that of the first stack plates, the first and second stack plates must be fabricated separately and then bonded together such that they are disposed alternately to one another. Manufacturing and assembly thereof are somewhat complicated, and thus, the manufacturing cost cannot be lowered.

SUMMARY OF THE INVENTION

The object of the present invention is to provide a heat dissipating device which provides an enhanced heat dissipating effect, and which is easy to manufacture and assemble.

Accordingly, the heat dissipating device of the present invention includes a plurality of heat dissipating plates which are disposed side by side. Each of the heat dissipating plates has a stack plate portion and a fin plate portion that extends integrally from the stack plate portion and that has a thickness smaller than that of the stack plate portion. The stack plate portions of the heat dissipating plates are in close contact with one another, and cooperatively form a stack part with a flat contact face adapted to be placed in contact with a heat generating article. The fin plate portions of the heat dissipating plates cooperatively form a fin part.

BRIEF DESCRIPTION OF THE DRAWINGS

Other features and advantages of the present invention will become apparent in the following detailed description of the preferred embodiments with reference to the accompanying drawings, in which.

DETAILED DESCRIPTION OF THE PREFERRED EMBODIMENTS

Figure 1:
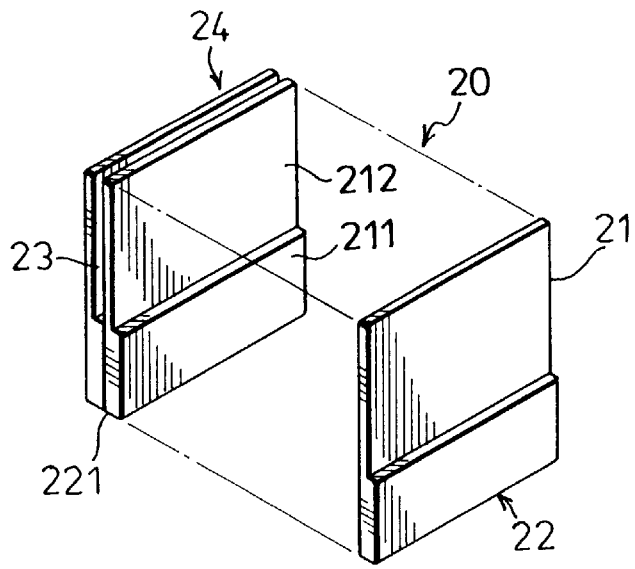
FIG. 1 is a perspective view illustrating a first preferred embodiment of the heat dissipating device according to the present invention.

Referring to FIG. 1, the first preferred embodiment of the heat dissipating device 20 of the present invention is shown to include a plurality of heat dissipating plates 21, each of which has a stack plate portion 211 and a fin plate portion 212. The fin plate portion 212 has a thickness smaller than that of the stack plate portion 211, and extends integrally and upwardly from the stack plate portion 211. The stack plate portion 211 of each of the heat dissipating plates 21 projects relative to the fin plate portion 212 at a front side of the heat dissipating plate 21. The heat dissipating plates 21 are disposed vertically and are arranged side by side so that the stack plate portions 211 are in close contact with one another. The stack plate portions 211 of the heat dissipating plates 21 have bottom surfaces that form a flat contact face 221 adapted to be placed in contact with a heat generating article (not shown). The fin plate portions 212 cooperatively form a fin part 24 having a plurality of heat dissipating spaces 23 which are formed between the fin plate portions 212 of adjacent pairs of the heat dissipating plates 21. The stack plate portions 211 of the heat dissipating plates 21 are bonded together by brazing with the use of an alloy material to form a stack part 22.

Figure 2:
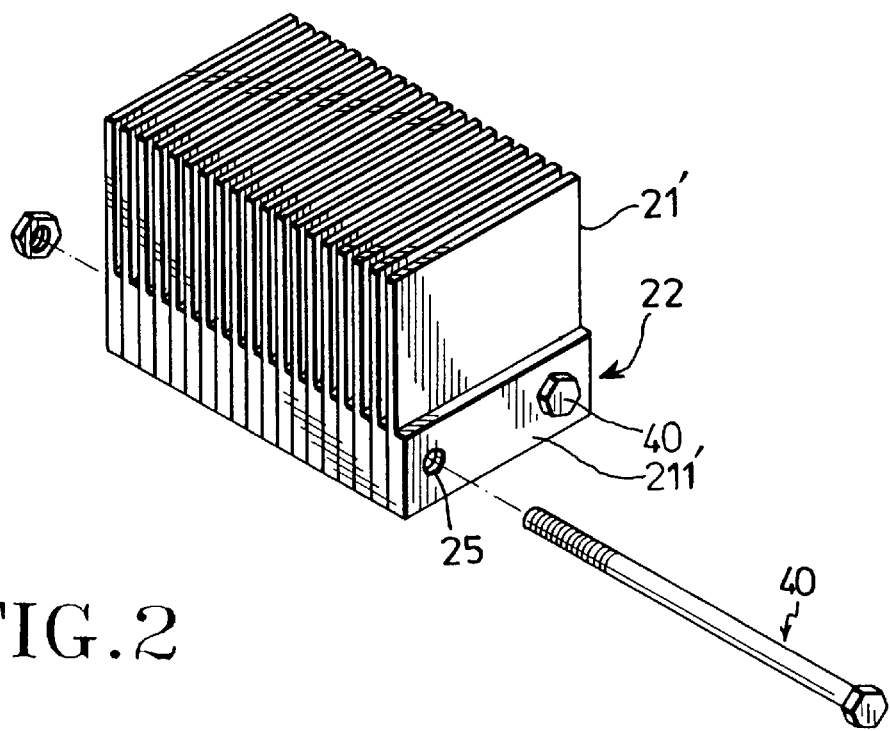
FIG. 2 is a perspective view illustrating a second preferred embodiment of the heat dissipating device according to the present invention.

Referring to FIG. 2, in a second preferred embodiment, the stack part 22 has two mounting holes 25 that are formed through the stack plate portions 211' of the heat dissipating plates 21'. A pair of screw fasteners 40 extend through the mounting holes 25, respectively, for fastening together the heat dissipating plates 21'.

Figure 3:
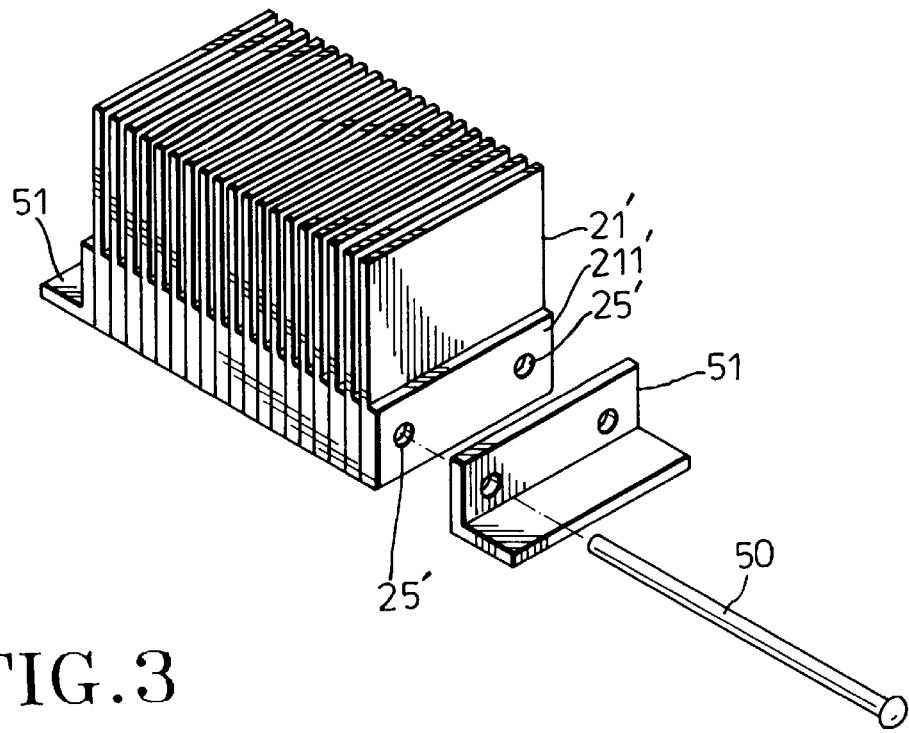
FIG. 3 is a perspective view illustrating a third preferred embodiment of the heat dissipating device according to the present invention.

Referring to FIG. 3, in a third preferred embodiment, the heat dissipating plates 21' are fastened together by means of a pair of rivets 50 (only one is shown). In this case, a pair of L-shaped mounting plates 51 are provided on two opposite sides of the stack part. A pair of mounting holes 25' are formed through the stack plate portions 211' of the heat dissipating plates 21' and through the mounting plates 51 to permit extension of the rivets 50 therethrough. Because the heat dissipating plates 21' are generally made to be relatively thin, the mounting plates 51 serve to protect the heat dissipating plates 21' from deformation during fastening thereof by the rivets 50.

Figure 4:
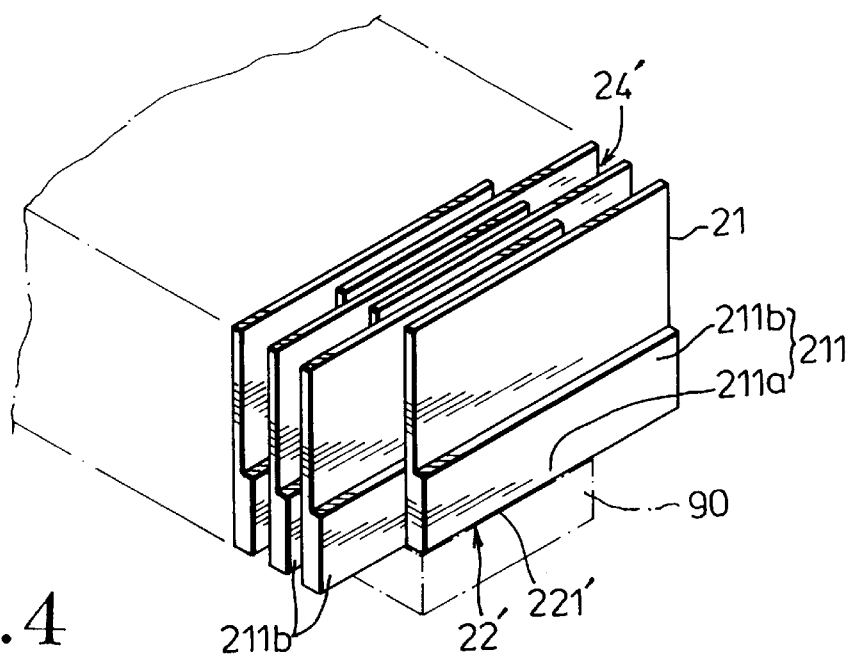
FIG. 4 is a fragmentary perspective view illustrating a fourth preferred embodiment of the heat dissipating device according to the present invention.

Referring to FIG. 4, the heat dissipating device according to a fourth preferred embodiment of this invention is shown to also include a plurality of the heat dissipating plates 21 that are staggered with one another such that the stack plate portion 211 of each of the heat dissipating plates 21 has a first section 211a overlapping and in close contact with the stack plate portion 211 of an adjacent one of the heat dissipating plates 21 to form a stack part 22' with a flat bottom surface 221' adapted to be placed in contact with a heat generating article 90. The stack plate portion 211 of each of the heat dissipating plates 21 further has a second section 211b projecting laterally relative to the adjacent one of the heat dissipating plates 21 without contacting the stack plate portion 211 of the adjacent heat dissipating plate 21. As shown, the laterally projecting parts 24' of the heat dissipating plates 21 are spaced from one another, and thus, can also serve to dissipate heat from the heat generating article 90.

Figure 5:
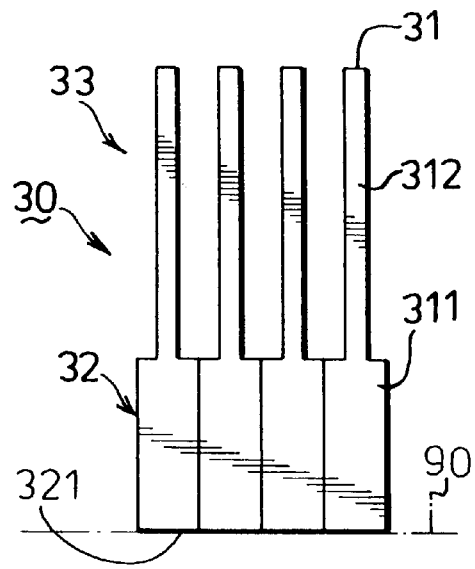
FIG. 5 is a side view illustrating a fifth preferred embodiment of the heat dissipating device according to the present invention.

Referring to FIG. 5, the heat dissipating device 30 according to a fifth preferred embodiment of the present invention is shown to also include a plurality of heat dissipating plates 31 having a thicker stack plate portion 311 to form a stack part 32, and a thinner fin plate portion 312 to form a fin part 33. The stack plate portions 311 of the heat dissipating plates 31 have bottom surfaces to form a flat contact face 321 adapted to be placed in contact with the heat generating article 90. The heat dissipating device 30 of the present embodiment differs from the heat dissipating device 20 of FIG. 1 in that the stack plate portion 311 of each of the heat dissipating plates 31 projects relative to the fin plate portion 312 at front and back sides of the heat dissipating plate 31.

Figure 6:
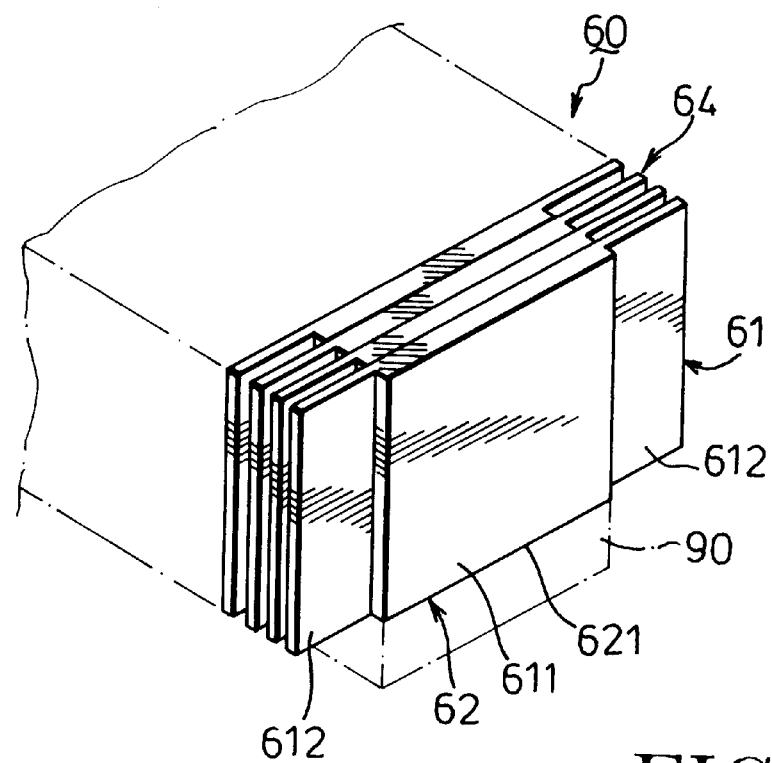
FIG. 6 is a fragmentary perspective view illustrating a sixth preferred embodiment of the heat dissipating device according to the present invention.

Referring to FIG. 6, the heat dissipating device 60 according to a sixth preferred embodiment of the present invention is shown to include a plurality of heat dissipating plates 61 which are disposed vertically and which are arranged side by side. Each of the heat dissipating plates 61 has a thicker stack plate portion 611 to form a stack part 62, and two thinner fin plate portions 612 that extend integrally and laterally from the stack plate portion 611 in opposite directions to form two fin parts 64. The stack plate portion 611 projects relative to the fin plate portions 612 at a front side of a respective one of the heat dissipating plates 61. The stack plate portions 611 are in close contact with one another to form a stack part 62, and have bottom surfaces that form a flat contact face 621 adapted to be placed in contact with the heat generating article 90. The fin plate portions 612 formed on the lateral sides of the stack plate portions 611 are spaced from one another to form the fin parts 64 at the lateral sides.

Figure 7:
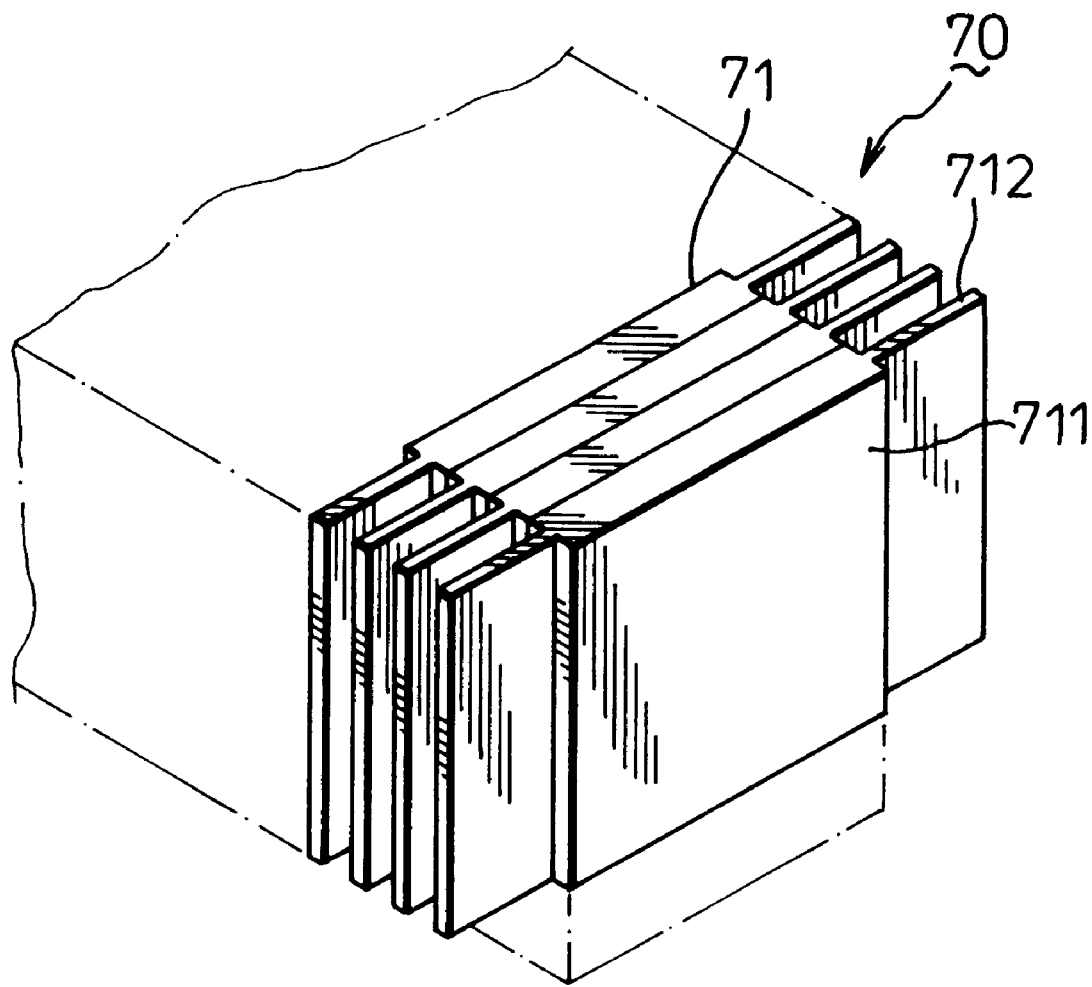
FIG. 7 is a fragmentary perspective view illustrating a seventh preferred embodiment of the heat dissipating device according to the present invention.

Referring to FIG. 7, the heat dissipating device 70 of a seventh preferred embodiment of the present invention is shown to have a structure similar to that of the heat dissipating device 60 shown in FIG. 6, except that the stack plate portion 711 of each of the heat dissipating plates 71 projects relative to the fin plate portions 712 at both front and back sides of the heat dissipating plates 71.

Figure 8:
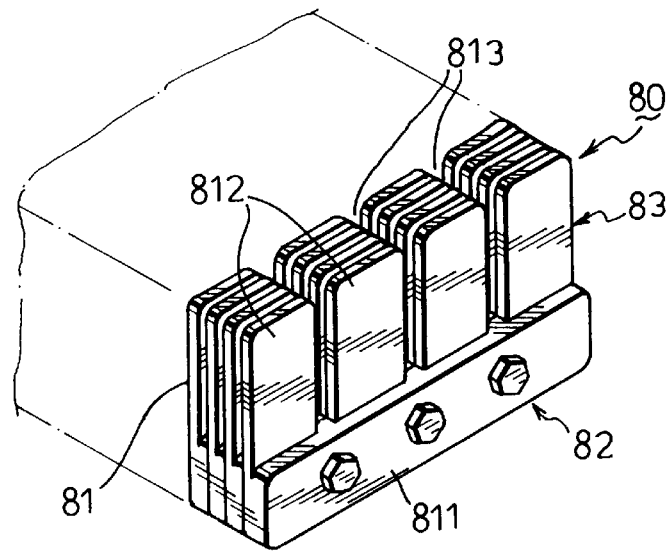
FIG. 8 is a fragmentary perspective view illustrating an eighth preferred embodiment of the heat dissipating device according to the present invention.

Referring to FIG. 8, the heat dissipating device 80 of an eighth preferred embodiment according to the present invention is shown to include a plurality of heat dissipating plates 81 that are disposed vertically and that are arranged side by side. Each of the heat dissipating plates 81 has a thicker stack plate portion 811 to form a stack part 82, and a fin plate portion to form a fin part 83. The fin plate portion of each of the heat dissipating plates 81 includes four fin segments 812 that extend upwardly and integrally from the stack plate portion 811. A clearance 813 is defined between an adjacent pair of the fin segments 812 of a respective one of the heat dissipating plates 81. The fin segments 812 of the fin plate portion of each of the heat dissipating plates 81 are aligned respectively with the fin segments 812 of the fin plate portion of an adjacent one of the heat dissipating plates 81 to provide the fin part 83 with four rows of the fin segments 812. The clearances 813 can provide the fin part 83 with an enhanced heat dissipating effect. Also, the clearances 813 permit extension of a clamp thereinto in order to bring the device to a predetermined position for contact with a heat generating article.

Figure 9:
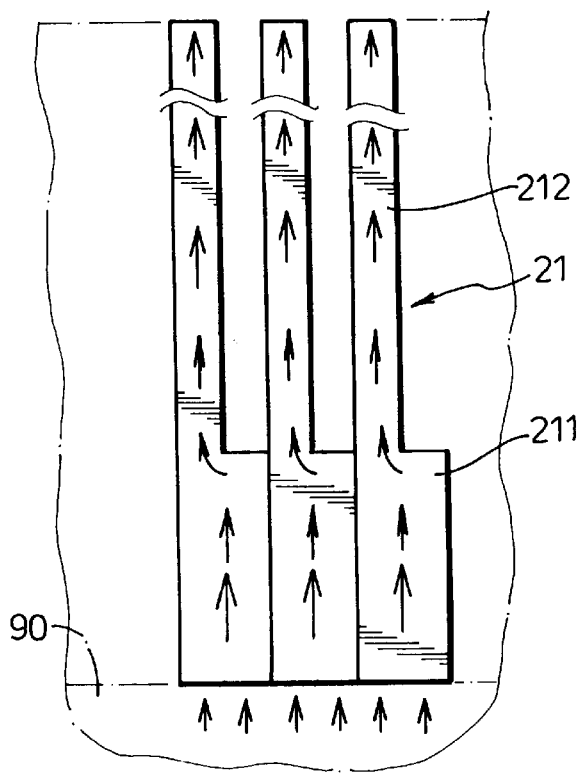
FIG. 9 is a fragmentary side view of a heat dissipating device according to the present invention, illustrating how heat is transferred from the stack plate portions to the fin plate portions of the heat dissipating plates.

The heat dissipating plates of the heat dissipating devices of the present invention are preferably made of an extruded aluminum alloy, and are preferably made to be relatively thin so as to provide an increased heat dissipating area to enhance the heat dissipating effect. Heat transfer between the stack plate portion and the fin plate portion will now be illustrated in terms of the first preferred embodiment. Referring to FIG. 9, since the fin plate portion 212 of each of the heat dissipating plates 21 is formed integrally with the stack plate portion 211, there is no contact face between the fin pate portion 212 and the stack plate portion 211 of the heat dissipating plate 21. Retarding of heat transfer between the stack plate portion 211 and the fin plate portion 212 of the heat dissipating plate 21 can be prevented. The heat dissipating device of the present invention thus provides an enhanced heat dissipating effect when compared with the aforementioned prior art.

In addition, since the heat dissipating plates of the heat dissipating device of the present invention are identical in shape, manufacturing thereof involves the use of only one mold. Moreover, assembly of the heat dissipating device is simplified as compared to that of the aforementioned prior art by obviating the need for arranging alternately the heat dissipating plates.

With this invention thus explained, it is apparent that numerous modifications and variations can be made without departing from the scope and spirit of this invention. It is therefore intended that this invention be limited only as indicated in the appended claims.

I claim:

1. A heat dissipating device, comprising: a plurality of heat dissipating plates which are disposed side by side, each of said heat dissipating plates having a stack plate portion and a fin plate portion that extends integrally from said stack plate portion and that has a thickness smaller than that of said stack plate portion, said stack plate portions of said heat dissipating plates being in close contact with one another and cooperatively forming a stack part with a flat contact face adapted to be placed in contact with a heat generating article, said fin plate portions of said heat dissipating plates cooperatively forming a fin part, said heat dissipating plates being staggered with one another such that said stack plate portion of each of said heat dissipating plates has a first section in close contact with said stack plate portion of an adjacent one of said heat dissipating plates and a second section projecting laterally relative to said stack plate portion of said adjacent one of said heat dissipating plates.

2. The heat dissipating device according to claim 1, wherein said stack plate portion of each of said heat dissipating plates has a bottom surface to form said contact face, said fin plate portion of each of said heat dissipating plates extending upwardly from said stack plate portion, each of said heat dissipating plates projecting laterally relative to an adjacent one of said heat dissipating plates.

* * * * *